United States Patent [19]

Aoyama et al.

[11] Patent Number: 4,507,673
[45] Date of Patent: Mar. 26, 1985

[54] SEMICONDUCTOR MEMORY DEVICE

[75] Inventors: Masaharu Aoyama; Shunichi Hiraki, both of Yokohama; Toshio Yonezawa, Yokosuka, all of Japan

[73] Assignee: Tokyo Shibaura Denki Kabushiki Kaisha, Japan

[21] Appl. No.: 534,361

[22] Filed: Sep. 21, 1983

Related U.S. Application Data

[63] Continuation of Ser. No. 194,813, Oct. 7, 1980, abandoned.

[30] Foreign Application Priority Data

Oct. 13, 1979 [JP] Japan .................. 54-132059

[51] Int. Cl.³ .......................................... H01L 29/78
[52] U.S. Cl. ........................... 357/23 R; 357/23.5; 357/23.15; 357/54
[58] Field of Search ............... 357/54, 23.5, 23.15, 357/23 R

[56] References Cited

U.S. PATENT DOCUMENTS

| | | | |
|---|---|---|---|
| 3,455,020 | 7/1969 | Dawson | 357/54 X |
| 4,151,537 | 4/1979 | Goldman | 357/54 X |
| 4,161,743 | 7/1979 | Yonezawa | 357/54 |
| 4,163,985 | 8/1979 | Schuermeyer | 357/54 X |
| 4,173,766 | 11/1979 | Mayes | 357/54 X |

Primary Examiner—Martin H. Edlow
Attorney, Agent, or Firm—Finnegan, Henderson, Farabow, Garrett & Dunner

[57] ABSTRACT

A semiconductor memory device is disclosed which comprises:
- a semiconductor substrate of n conductivity type;
- source and drain regions of p+ conductivity type formed in the substrate;
- a first gate insulation film of silicon dioxide ($SiO_2$) formed on the substrate; and
- a second gate insulation film of silicon carbide (SiC) formed on the first gate insulation film.

5 Claims, 19 Drawing Figures

4,507,673

SEMICONDUCTOR MEMORY DEVICE

This is a continuation, of application Ser. No. 06/194,813, filed Oct. 7, 1980, now abandoned.

BACKGROUND OF THE INVENTION

The present invention relates to a semiconductor memory device for storing data utilizing carrier trapping at the interface of double gate insulation films.

There are two conventional forms for writing data of "1" level and "0" level in an FET (field effect transistor) which is used as a nonvolatile memory element. In the first method, a voltage is applied between the gate electrode and the semiconductor substrate to cause a tunnel phenomenon. The carriers in the substrate are thus injected through the barrier and are trapped in the low energy layer. In the second method, a high voltage is applied between the source and drain to cause an avalanche phenomenon. The carriers in the substrate are thus injected through the barrier and are trapped in the low energy layer. In an FET for storing data utilizing the tunnel phenomenon, the carriers are mainly trapped at and in the vicinity of the interface of double insulating layers consisting of a silicon nitride film ($Si_3N_4$) or an alumina film ($Al_2O_3$), and a thin silicon dioxide film ($SiO_2$).

In an FET for storing data utilizing the avalanche phenomenon, polycrystalline silicon as a floating gate embedded in the $SiO_2$ film is used as the low energy layer for storing the carriers.

When a comparison is made between an FET utilizing the tunnel phenomenon and an FET utilizing the avalanche phenomenon, the FET utilizing the tunnel phenomenon is superior to the other since it provides greater ease in clearing the data and allows a higher packing density.

FIG. 1 presents characteristic curves showing the relation between the gate voltage VG and the threshold voltage Vth of an FET of conventional construction which utilizes the tunnel phenomenon.

Referring to FIG. 1, the curve "A" is the characteristic curve for MAOS (metal alumina oxide semiconductor) FET, and "B" is a characteristic curve for an MNOS (metal nitride oxide semiconductor) FET. In the MAOS FET, the double gate insulation films consist of an $SiO_2$ film formed on the substrate and an alumina ($Al_2O_3$) film formed on the $SiO_2$ film. In the MNOS FET, the double gate insulating films consist of an $SiO_2$ film formed on the substrate and a silicon nitride ($Si_3N_4$) film formed on the $SiO_2$ film.

As may be apparent from the characteristic curves of FIG. 1, a gate voltage of over about ±40 V must be applied in the case of the MAOS FET (curve A) and over +10 V and less than −20 V in the case of the MNOS FET (curve B) for varying the threshold voltage Vth. That is to say, the writing and clearing of the data cannot be effected unless a considerably high gate voltage is applied.

Thus, the conventional FET has suffered the problem that a considerably high gate voltage must be applied for writing and clearing the data.

SUMMARY OF THE INVENTION

The present invention has been made to overcome this problem and has for its object to provide a semiconductor memory device which reduces to the minimum gate voltage necessary for writing and clearing of the data.

To the above and other ends, the present invention provides a semiconductor memory device comprising:
  a semiconductor substrate of a first conductivity type;
  source and drain regions of a second conductivity type formed in the semiconductor substrate;
  a first gate insulation film of silicon dioxide formed on the substrate; and
  a second gate insulation film of silicon carbide formed on the first gate insulation film.

DETAILED DESCRIPTION OF THE PREFERRED EMBODIMENTS

Figure 1:
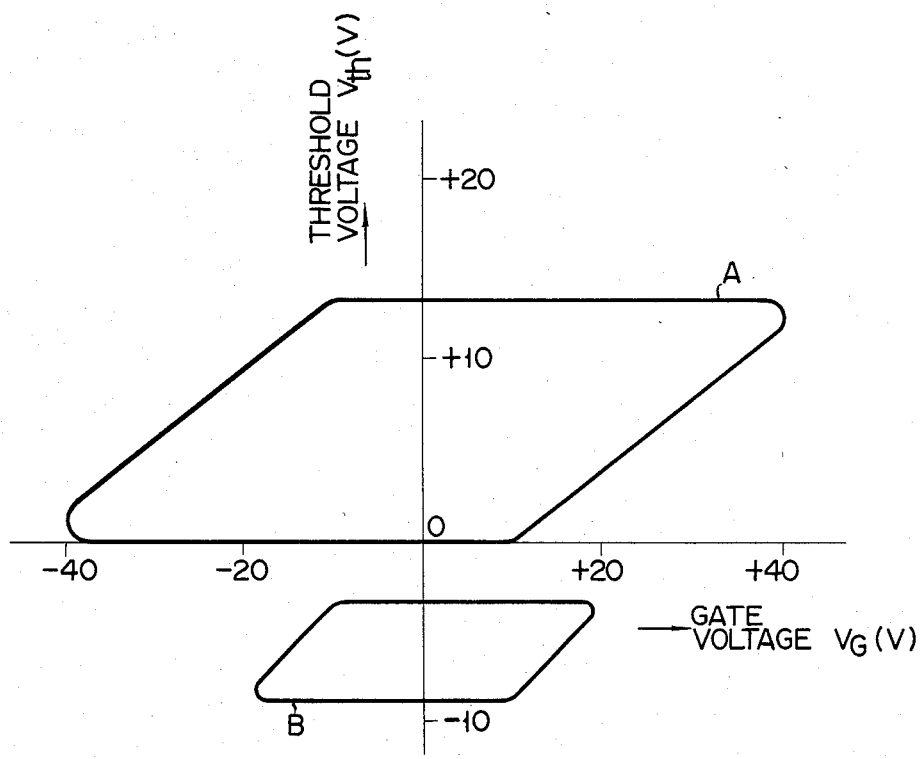
FIG. 1 presents characteristic curves showing the relation between the gate voltage VG and the threshold voltage Vth of a conventional tunnel phenomenon type FET.
Figure 2:
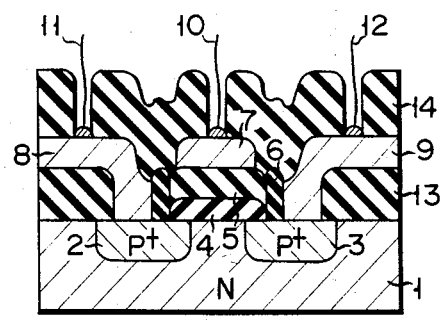
FIG. 2 is a view showing a semiconductor memory device in accordance with one embodiment of the present invention.

FIG. 2 shows the construction of a memory device (FET) of double gate insulation film construction of the present invention which stores data utilizing the tunnel phenomenon.

In an n-type silicon substrate 1 are formed a $p^+$-type source region 2 and a $p^+$-type drain region 3. A gate insulation film 4, e.g., of silicon dioxide ($SiO_2$), is formed on the channel region (between the $p^+$-type source region 2 and the $p^+$-type drain region 3) of the substrate 1. The $SiO_2$ film 4 is preferably as thin as about 50 to 100 Å. A gate insulation (SiC) film 5 of silicon carbide is formed on the $SiO_2$ film 4. The SiC film 5 preferably has a thickness of about 1,000 Å. The surface of the SiC film 5 except its major surface is surrounded by an $SiO_2$ film 6. A gate electrode 7 of aluminum is formed on the SiC film 5. A source electrode 8 and a drain electrode 9 of aluminum are formed on the source region 2 and the drain region 3, respectively. In a packaging process, a gate lead wire 10, a source lead wire 11, and a drain lead wire 12 are formed on the gate electrode 7, the source electrode 8, and the drain electrode 9, respectively. Reference numeral 13 denotes a field oxidation film which is formed with the insulation film 6, and reference numeral 14 denotes a passivation film.

In an FET of the construction shown in FIG. 2, when a positive voltage is applied to the gate electrode 7, the electrons in the conduction band of the substrate 1 are injected in the thin $SiO_2$ film 4 of about 50 to 100 Å thickness by the tunnel phenomenon and are mainly trapped in the interface of the $SiO_2$ film 4 and the SiC film 5 and in the vicinity thereof. As a result, the threshold voltage Vth of the FET is shifted toward the positive.

The same applies to the holes when a negative voltage is applied. When a negative voltage is applied to the gate electrode 7, the holes present in the conduction band of the substrate 1 are injected through the $SiO_2$ film 4 and are mainly trapped at the interface between the $SiO_2$ film 4 and the SiC film 5 and in the vicinity thereof by the tunnel phenomenon. Consequently, the threshold voltage of the FET is shifted toward the negative.

In a device as shown in FIG. 2, the thickness of the $SiO_2$ film 4 was described to be preferably about 50 to 100 Å. This is for improving the implantation efficiency when implanting carriers from the substrate 1 in the SiC film 5 by making it easier for them to be injected through the $SiO_2$ layer 4.

The $SiO_2$ film 6 is formed to prevent the escape of the carriers trapped between the $SiO_2$ film 4 and the SiC film 5 to the outside through the source electrode 8 and the drain electrode 9.

Figure 3:
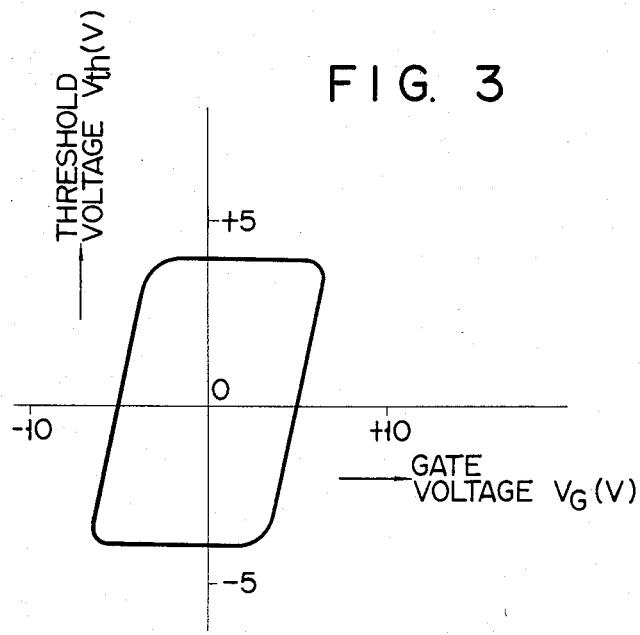
FIG. 3 presents characteristic curves showing the relation between the gate voltage VG and the threshold voltage Vth of the semiconductor memory device shown in FIG. 2.

The characteristic curve showing the relation between the gate voltage VG and the threshold voltage Vth of the FET shown in FIG. 2 is shown in FIG. 3.

As may be apparent from the characteristic curve, the threshold voltage Vth may be varied with small gate voltages of less than ±10 V. As a result, writing and clearing of the data is possible with a gate voltage smaller than that required for a conventional FET. The reason why the threshold voltage Vth may be varied with a small voltage is attributed to the fact that the SiC film 5 functions with high efficiency to trap the electrons and holes at the interface between the SiC film 5 and the $SiO_2$ film 4 and the vicinity thereof.

Further, as may be apparent from FIG. 3, the range of change of the threshold voltage Vth of the FET shown in FIG. 2 covers both the positive and negative values, and the level where the threshold voltage is zero is positioned substantially at the center, between the maximum threshold voltage and the minimum threshold voltage of the curve. Thus, for reading the data, it is not necessary to apply a gate voltage for setting the level of the reference threshold voltage level at the center between the maximum threshold voltage and the minimum threshold voltage.

There are several effects obtained with this embodiment. Due to the double gate insulation film construction consisting of the gate insulation SiC film 5 and the $SiO_2$ film 4, the trapping function at the interface thereof is higher than that of the conventional construction; and the silicon carbide itself has semiconductive characteristics.

It is possible to further improve the voltage resistance and the insulation of the insulation film 5 by doping nitrogen or oxygen in the SiC film 5.

The process for manufacturing the semiconductor memory device shown in FIG. 2 will be described referring to FIGS. 4A to 4N.

Figure 4A:
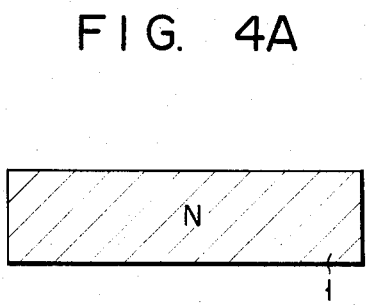
FIGS. 4A to 4N are views illustrating the manufacturing procedure of the memory device shown in FIG. 2.

An n-type silicon substrate 1 of crystal orientation (1 0 0 ) and of about 3 to 5 ($\Omega$.cm) specific resistance is prepared as shown in FIG. 4A.

Figure 4B:
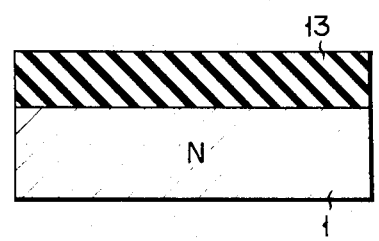

The major surface of the substrate 1 undergoes thermal oxidation and an $SiO_2$ film 13 is formed as shown in FIG. 4B. This $SiO_2$ film is a field insulation film.

Figure 4C:
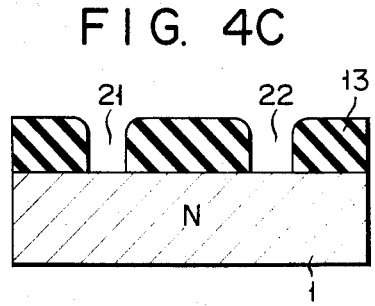

The $SiO_2$ film 13 is then etched to form holes 21 and 22 at positions of the $SiO_2$ film 13 corresponding to the source region forming part and the drain region forming part of the substrate 1 as shown in FIG. 4C.

Figure 4D:
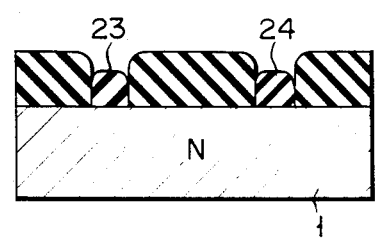

The exposed portion of the substrate 1 from the holes 21 and 22 is oxidized to form $SiO_2$ films 23 and 24 as shown in FIG. 4D.

Figure 4E:
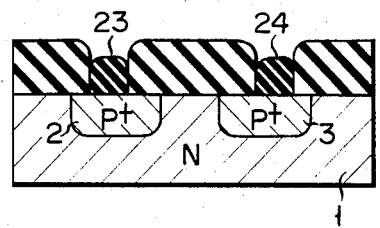

Boron ions are implanted in the substrate 1 through the $SiO_2$ films 23 and 24 for forming in the substrate 1 $p^+$-type regions 2 and 3 which function as the source region and the drain region as shown in FIG. 4E.

Figure 4F:
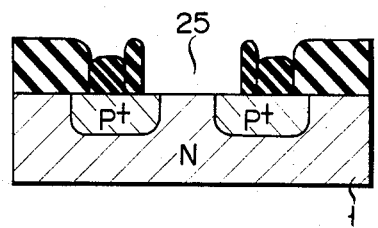

The $SiO_2$ film located above the channel region (region between the $p^+$-type region 2 and the $p^+$-type region 3) of the substrate 1 is selectively removed by etching and a hole 25 communicating with the channel region is formed as shown in FIG. 4F.

Figure 4G:
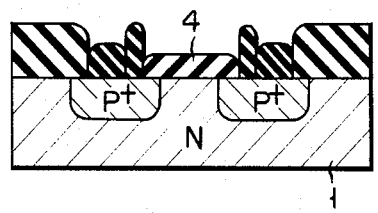

The structure is heated to 800° C. in a dry oxygen gas atmosphere and an $SiO_2$ film (gate insulation film) 4 of about 50 to 100 Å thickness is formed on the channel region, as shown in FIG. 4G.

Figure 4H:
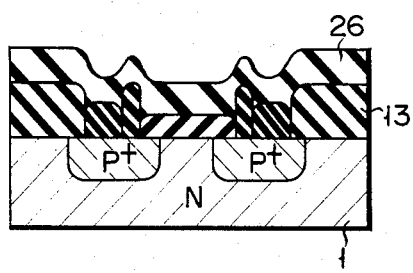

Silicon carbide (SiC) is deposited on the major surface of the structure by high frequency plasma sputtering. The structure is then annealed for 10 minutes at 500° C. in a nitrogen gas atmosphere to the SiC as shown in FIG. 4H.

Figure 4I:
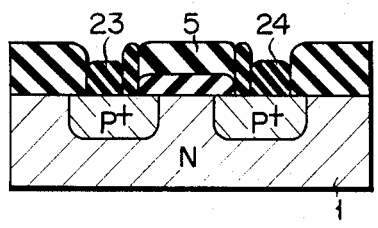

The SiC film 26 is then selectively etched so that parts other than that to become the gate insulation film 5 are removed, as shown in FIG. 4I.

Figure 4J:
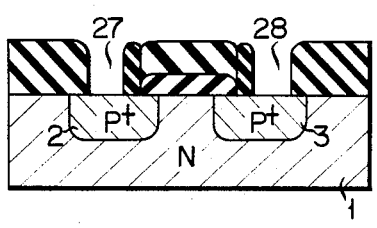

The $SiO_2$ films 23 and 24 are thereafter etched to form contact holes 27 and 28 and to expose the source region 2 and the drain region 3, as shown in FIG. 4J.

Figure 4K:
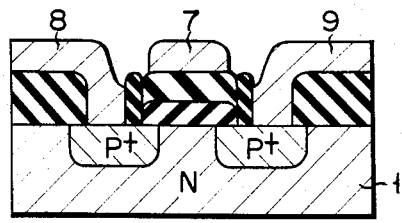
Figure 4L:
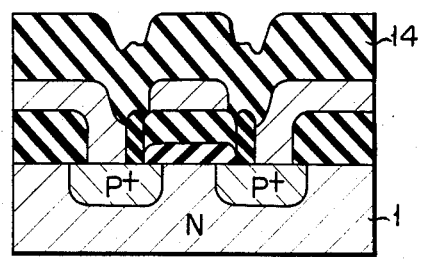

After aluminum is deposited on the major surface of the structure, patterning is performed, and annealing is performed at about 450° C. for about 30 minutes to form the gate electrode 7, the source electrode 8 and the drain electrode 9, as shown in FIG. 4K.

A passivation film 14 is then coated on the entire surface of the structure by the CVD (chemical vapor deposition) method.

Figure 4M:
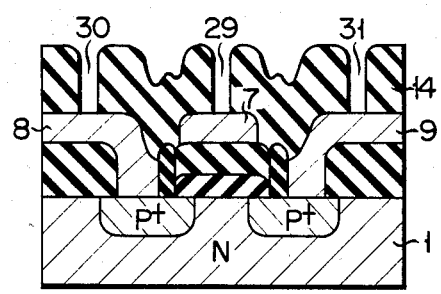

The passivation film 14 is etched to form contact holes 29, 30 and 31 communicating with the gate electrode 7, the source electrode 8 and the drain electrode 9, respectively, as shown in FIG. 4M.

In FIG. 4M, the hole 29 is shown as if being provided on that portion of the gate electrode 7 over the channel portion of the substrate 1. However, the hole 29 is actually provided on that portion of the gate electrode 7 which is apart from that portion of the gate electrode 7 over the channel portion.

Figure 4N:
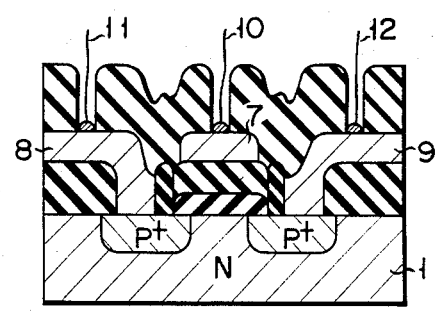

As shown in FIG. 4N, in packaging process, the gate lead wire 10, the source lead wire 11, and the drain lead wire 12 are bonded to the gate electrode 7, the source electrode 8 and the drain electrode 9 through the holes 29, 30 and 31, respectively.

An FET (semiconductor memory device) in accordance with the embodiment of the present invention as shown in FIG. 2 is provided by the process described with reference to FIGS. 4A to 4N.

Figure 5:
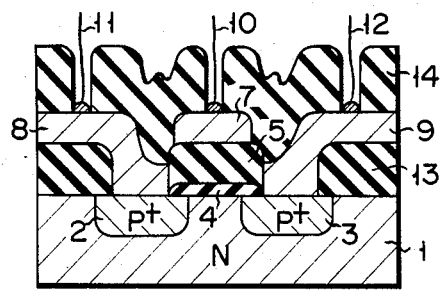
FIG. 5 is a view illustrating another embodiment of the present invention.

Another embodiment of the present invention is shown in FIG. 5. Since this embodiment is substantially the same except that the $SiO_2$ film 6 is not included as the above embodiment, the same parts will be designated by the same reference numerals, and detailed description will be omitted. Further, since the carrier injection due to the avalanche phenomenon is substantially the same, its description will be omitted here.

In this embodiment, since the $SiO_2$ film 6 (FIG. 2) covering the side faces of the SiC film 5 is not formed, charge trapped at the interface of the $SiO_2$ film 4 and the SiC film 5 and its vicinity is considered to escape, although in only a slight amount, through the source electrode 8 and the drain electrode 9.

However, substantially the same effects as obtained with the embodiment shown in FIG. 2 are obtained with this embodiment.

Figure 6:
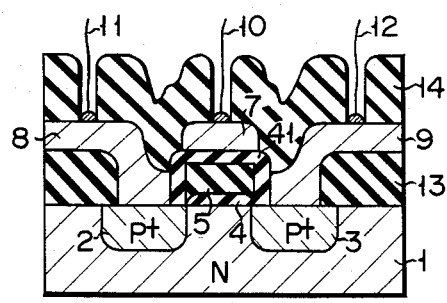
FIG. 6 is a view illustrating still another embodiment of the present invention.

FIG. 6 shows still another embodiment of the present invention.

In this embodiment, the SiC film 5 is fully surrounded by the SiO₂ film 4 and an insulation film 41. That is, the SiC film 5 is of the floating gate construction according to which it is embedded in the gate insulation film structure (consisting of the SiO₂ film 4 and the insulation film 41). For the injection of the carriers in this construction, as in the case of the embodiment of FIG. 2, a gate voltage is applied to the gate electrode 7 for moving the carriers toward the SiC film 5 through the SiO₂ film 4 and trapping the carriers in the interface of the SiO₂ film 4 and the SiC film 5 and its vicinity.

In this embodiment, since the SiC film 5 is surrounded by the SiO₂ film 4 and the insulation film 41, the escape of the trapped carriers to the outside through the source electrode 8 and the drain electrode 9 is prevented, and their escape through the gate electrode 7 is also prevented, so that the device's ability to maintain the data is vastly improved. In the case of this embodiment, the formation of the insulation film 41 is easy and the voltage resistance is improved.

Although the embodiments shown in FIGS. 2, 5 and 6 have been described with reference to the storing of data utilizing the tunnel phenomenon, the memory devices (FETs) of these embodiments may be used for trapping carriers utilizing the avalanche phenomenon, with no modification in the construction. In this case, a negative voltage is applied to the source electrode 8 and a drain electrode 9. The avalanche phenomenon is caused at the plane of contact between the source electrode 8 and the channel region and the plane of contact between the drain electrode 9 and the channel region. In addition, the tunnel phenomenon is caused at the central portion of the channel region. The electrons are injected in the SiO₂ film 4, move toward the SiC film 5 and are trapped at the interface of the SiO₂ film 4 and the SiC film 5 and in that vicinity.

In the embodiments shown in FIGS. 4 and 5, the thickness of the SiO₂ film 4 is preferably 50 to 100 Å and the thickness of the SiC film 5 is preferably about 1,000 Å for the same reasons as in the embodiment shown in FIG. 2.

Although the present invention has been described in detail with reference to its particular embodiments, the present invention is not limited to the particular embodiments disclosed herein. Therefore, it is to be understood that various modifications may be made without departing from the spirit and scope of the present invention.

What we claim is:

1. A semiconductor memory device comprising:
   a semiconductor substrate of a first conductivity type;
   source and drain regions of a second conductivity type formed in said semiconductor substrate;
   a first gate insulation film of silicon dioxide formed on said semiconductor substrate and having a thickness about 50 to 100 Å; and
   means for changing the threshold voltage of said memory device between a positive maximum threshold voltage and a negative maximum threshold voltage with a gate voltage of less than ±10 V and for establishing a threshold voltage of zero volts substantially at the center of said positive maximum threshold voltage and said negative maximum threshold voltage, said means comprising a second gate insulation film of silicon carbide formed on said first gate insulation film.

2. A semiconductor memory device according to claim 1 wherein said second gate insulation film has a thickness of about 1,000 Å.

3. A semiconductor memory device according to claim 1 further including an insulation film which surrounds the second gate insulation film leaving the major surface thereof uncovered.

4. A semiconductor memory device according to claim 1 further including an insulation film which fully surrounds the second gate insulation film.

5. A semiconductor memory device according to claim 1, 3 or 4 further including an aluminium electrode provided over the second gate insulation film of silicon carbide.

* * * * *